United States Patent [19]

Boyd, Sr.

[11] Patent Number: 5,008,626
[45] Date of Patent: Apr. 16, 1991

[54] DIRECT CURRENT MINIATURE LAMP TESTER

[76] Inventor: William P. Boyd, Sr., 4624 N. William Ct., Stillwater, Okla. 74075

[21] Appl. No.: 524,533

[22] Filed: May 17, 1990

[51] Int. Cl.⁵ ............................................. G01R 31/00
[52] U.S. Cl. .................................. 324/414; 324/133; 324/556; 340/641
[58] Field of Search ............... 324/506, 507, 537, 555, 324/556, 133, 403, 414; 340/641

[56] References Cited

U.S. PATENT DOCUMENTS

| | | | |
|---|---|---|---|
| 2,746,011 | 5/1956 | Carson | 324/414 |
| 3,063,006 | 11/1962 | Steinberger | 324/506 X |
| 3,725,780 | 4/1973 | Olin | 324/51 |
| 4,361,800 | 11/1982 | Fodali et al. | 324/556 |
| 4,605,895 | 8/1986 | Park | 324/133 |

FOREIGN PATENT DOCUMENTS

| | | | |
|---|---|---|---|
| 513225 | 5/1955 | Canada | 324/133 |
| 2090001 | 6/1982 | United Kingdom | 324/133 |

Primary Examiner—Kenneth Wieder
Assistant Examiner—Jack B. Harvey
Attorney, Agent, or Firm—Robert K. Rhea

[57] ABSTRACT

A portable DC miniature lamp tester is formed by a generally rectangular translucent body formed from plastic material having an open socket therein for reception of the bayonet end of the lamp and a pair of conventional snap-tab connectors for cooperatively connecting the body to the terminals of a conventional 9-volt dry cell battery. The auxiliary lamp is illuminated when either the incandescent filament of the lamp under test or its shunt is still good and conducts current.

2 Claims, 1 Drawing Sheet

DIRECT CURRENT MINIATURE LAMP TESTER

BACKGROUND OF THE INVENTION

1. Field of the Invention

This invention relates to incandescent lamps of miniature size, commonly known as Christmas tree lamps, and more particularly to a tester for such lamps.

The small incandescent low voltage, approximately 2½ volts to 12 volts, lamps commonly called Christmas tree lights or lamps are normally interposed in sockets at selected locations in an electrical series circuit and used for decorations, either indoors or outdoors.

These miniature or "mini" lamps are characterized by a bayonet base approximately 5 mm×3 mm×6 mm long and in addition to its tungsten illumination element, includes a shunt circuit which provides continuity in the electric series circuit when the incandescent element burns out. Thus, sustaining the continuity of current in the string or circuit, normally some 10 to 50 lamps.

With the loss of the tungsten element in any one mini lamp the rated voltage of the lamp is added and equally distributed to the remaining lamps in that series circuit by the shunt circuit of the burned out lamp.

As tungsten elements burn out in additional lamps, additional voltage is applied to the remaining lamps which is a distinct disadvantage resulting in a further increase of loss of tungsten elements in other lamps.

The voltage then increases to an extent that it destroys the remaining tungsten elements and one or more of the lamp internal shunt.

Attempting to solve the burned out string of lamps by exchanging a new lamp with a bad one and checking lamps along the stringer in domino style, is successful unless at least two lamps have lost their shunt circuit. In the latter case, the domino style of checking lamps in succession will not succeed. It is at this point that the device of this invention may be employed to test the incandescent element and shunt circuit of each burned out lamp, including the blinker control if one is used.

2. Description of the Prior Art

The most prior patent is believed to be U.S. Pat. No. 3,725,780. This patent provides a container supporting a 9-volt battery connected by wiring with a pair of lamp or bulb testing terminals each terminal being formed by a plurality of juxtaposed electrical current conducting bristles arranged in opposition so that the base or contacts of a miniature lamp may be contacted when the base or screw end of the bulb is inserted between the bristle terminals to determine whether or not the bulb element is burned out.

This invention is distinct over this patent and other lamp testing patents by providing an internal electrical current-excited tungsten element including a shunt which not only indicates whether or not the tungsten element under test is burned out or if its shunt circuit is still intact or broken by the illumination or nonillumination of the tester contained control element.

SUMMARY OF THE INVENTION

A generally rectangular body formed from preferably plastic translucent material is provided with a vertical socket for receiving the bayonet end of a miniature lamp having exposed contacts.

The socket in the body is provided with a pair of contacts on opposing surfaces. One socket contact is connected with a positive terminal engaging a conventional 9-volt battery positive terminal.

The other socket contact is connected with the negative terminal of the battery through an incandescent lamp contained by the body.

The principal objects of this invention is to provide a relatively small, economical, user friendly miniature lamp tester energized by a transistor radio battery capable of identifying a burned out element or elements in miniature Christmas tree decoration lamps of the series circuit type.

DESCRIPTION OF THE PREFERRED EMBODIMENTS

Figure 1:
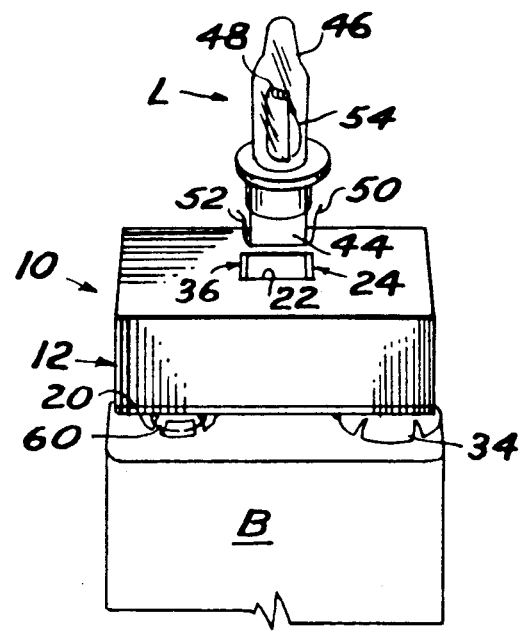
FIG. 1 is fragmentary perspective view of the lamp tester illustrating a miniature lamp in exploded relation.

Like characters of reference designate like parts in those figures of the drawings in which they occur.

In the drawings:

The reference numeral 10 indicates the lamp tester as a whole which is rectangular in general configuration and is connected in the manner hereinafter explained with a direct current dry cell battery B.

The device 10 comprises a body 12 having opposing end and side surfaces 14 and 16, respectively, only one of each being shown, a top surface 18 and a presently described bottom wall or base 20.

The body 12 contains a vertical through opening 22 rectangular in transverse section for the purposes presently apparent.

The body 12 is preferably formed from translucent plastic material and is preferably molded with the bottom wall 20 thus closing the depending end of the opening 22 to form a socket and support the components presently described.

The base 20 is preferably rectangular planar and formed from hardboard or other rigid dielectric material.

The base 20 supports an upstanding L-shaped terminal 24 having its foot portion 26 flatly contacting the upper surface of the base 20 with its leg portion 28 dimensioned to be coextensively received within one end portion of the body socket 22.

The terminal foot 26 is line drilled as at 30 with the base for receiving an upstanding tubular portion 32 of a positive battery terminal socket 34 secured to the base and terminal 24 in a riveting action.

A second or opposite L-shaped negative terminal 36 has its foot portion 38 similarly flatly contacting the upper surface of the base 20 and its leg portion 40 disposed in the opposite end of the body socket 22 in confronting relation with respect to the leg 28 of the positive terminal 24. The foot portion 38 of the terminal 36 is riveted or otherwise rigidly joined, as at 42, to the base 20.

Figure 3:
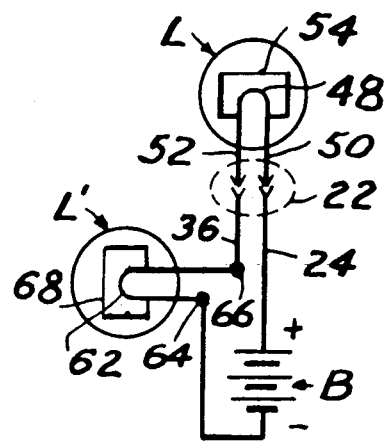

The body socket 22 cooperatively receives the bayonet end portion 44 of a Christmas tree lamp L. In addition to its bayonet end portion, the lamp L comprises an upstanding bulb portion 46 formed from glass and contains a tungsten incandescent element 48 (FIGS. 1 and 3). Respective terminal wires 50 and 52 project through the depending end of the bayonet end of the lamp and are turned back upwardly on the outer surface of the respective end of the rectangular shaped bayonet end, as viewed in FIG. 1, for the purpose of contacting in electrical conducting relation the respective leg 28 and 40 of the terminals 24 and 36.

The lamp bulb portion further includes a shunt circuit 54 for the purposes previously explained.

Figure 2:
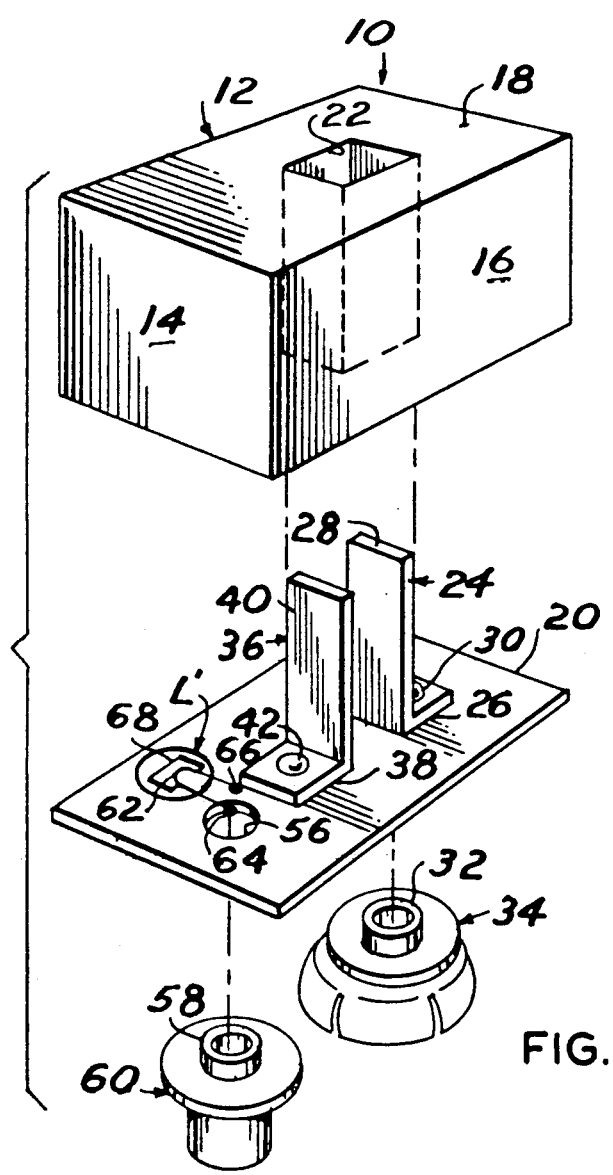
FIG. 2 is an exploded perspective view, to a larger scale, of the miniature lamp tester schematically illustrating a portion of the circuit; and, FIG. 3 is a schematic of the tester circuit and a lamp under test.

Referring again to FIG. 2, the base 20 is provided with an aperture 56 adjacent the foot 38 of its terminal 36 which cooperatively receives a tube portion 58 of a negative terminal contact 60 which is rigidly connected with the base as by a riveting action.

A monitor lamp L' is disposed on the base 20 and contained by the body 12 with its incandescent filament 62 connected with terminals 64 and 66 respectively connected with the negative battery terminal 60 and the foot portion 38 of the socket negative terminal 36. The lamp L' also contains a shunt circuit 68.

OPERATION

In operation it is assumed the tester 10 is connected with the battery B. Most home owners keep a supply of miniature lamps on hand for replacing lamps which burn out unexpectedly.

If one of the supply lamps is to be placed in the circuit in operation and to be sure the lamp filament is good, it is first tested by the tester 10. The lamp exposed terminals 50 and 52 are manually placed in proper aligned relation at the respective narrow end portions of the bayonet end 44 of the lamp.

The lamp L is manually inserted into the socket 22. Since the lamp L acts as a switch in closing the electric circuit, o the filament 62 of the lamp L' immediately lights. If the filament 48 of the lamp L is good it also is excited and illuminates.

In the event the filament of the lamp L is broken, and the filament 62 of the lamp L' remains illuminated the operator knows the filament of the lamp L has "burned out" but the shunt circuit 54 is still conducting.

In the event that both the incandescent filament 48 and shunt circuit 54 of the lamp L is broken and the filament 62 of the Lamp' is not excited, the lamp L is therefore of no further use and should be discarded.

This testing sequence is repeated for all the lamps under question.

Obviously the invention is susceptible to changes or alterations without defeating its practicability. Therefore, I do not wish to be confined to the preferred embodiment shown in the drawings and described herein.

I claim:

1. A direct current tester for a bayonet-type miniature electric lamp having an incandescent filament and a shunt circuit, comprising:

a dielectric rectangular translucent body having a top surface and having a bottom surface overlying a dielectric thin, when compared with the thickness of said body, planar base, said body having a central upwardly open rectangular socket dimensioned for nesting in electrical circuit contacting relation the bayonet end portion of a miniature electric lamp;

a pair of upstanding strap metal L-shaped body socket terminals, each terminal of said pair of body socket terminals having a foot portion and a leg portion and having their respective foot portions flatly interposed between said base and said body and secured in spaced-apart relation to said base and having their respective leg portions coextensive with and flatly disposed, in confronting relation, on opposing surfaces of the walls defining the body socket;

a first pair of snap-tab type battery terminals, one terminal of said first pair of battery terminals depending from said base and connected with the foot portion of one body socket terminal of said pair of body socket terminals, the other battery terminal of said first pair of battery terminals depending from and connected with said base in longitudinally spaced relation with respect to the position of the foot portion of the other said body socket terminal on said base;

a dry cell direct current battery having a second pair of battery terminals cooperatively received in electrical conducting relation by said first pair of battery terminals; and, circuit means supported by the body and electrically connected with the said other battery terminal of said first pair of battery terminals and having an auxiliary miniature electric lamp having an incandescent filament circuit interposed between the other said foot portion of said other body socket terminal of said pair of body socket terminals and said other terminal of said first pair of battery terminals for indicating a closed circuit through the incandescent filament of a miniature lamp under test, by the battery potential exciting said auxiliary incandescent filament and the incandescent filament of a miniature lamp under test or a closed circuit through only the shunt circuit of a miniature lamp under test by the illuminating glow of said body from the battery potential excited incandescent filament of the auxiliary lamp.

2. The lamp tester according to claim 1 and further including:

a normally open shunt circuit connected in parallel with the auxiliary lamp incandescent filament and rendered conductive by failure of the auxiliary lamp incandescent filament.

* * * * *